(12) United States Patent
Colombo et al.

(10) Patent No.: US 6,809,370 B1
(45) Date of Patent: Oct. 26, 2004

(54) HIGH-K GATE DIELECTRIC WITH UNIFORM NITROGEN PROFILE AND METHODS FOR MAKING THE SAME

(75) Inventors: Luigi Colombo, Dallas, TX (US); Manuel Quevedo-Lopez, Denton, TX (US); James J. Chambers, Dallas, TX (US); Mark R. Visokay, Richardson, TX (US); Antonio L. P. Rotondaro, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/632,230

(22) Filed: Jul. 31, 2003

(51) Int. Cl.[7] ............................................. H01L 27/108
(52) U.S. Cl. ...................... 257/310; 257/347; 257/368; 257/369; 257/410; 257/411; 438/199; 438/479; 438/517; 438/595

(56) References Cited

U.S. PATENT DOCUMENTS

| | | | |
|---|---|---|---|
| 5,352,623 A | 10/1994 | Kamiyama | |
| 5,910,880 A | 6/1999 | DeBoer et al. | |
| 6,013,553 A | 1/2000 | Wallace et al. | |
| 6,015,739 A | 1/2000 | Gardner et al. | |
| 6,020,243 A | 2/2000 | Wallace et al. | |
| 6,136,654 A | 10/2000 | Kraft et al. | |
| 6,207,542 B1 * | 3/2001 | Ibok | 438/585 |
| 6,251,761 B1 | 6/2001 | Rodder et al. | |
| 6,291,866 B1 | 9/2001 | Wallace et al. | |
| 6,291,867 B1 | 9/2001 | Wallace et al. | |
| 6,436,801 B1 | 8/2002 | Wilk et al. | |
| 2003/0080389 A1 | 5/2003 | Hu et al. | |
| 2004/0023513 A1 * | 2/2004 | Aoyama et al. | 438/778 |

OTHER PUBLICATIONS

Fabrication of HfSiON Gate Dielectrics by Plasma Oxidation and Nitridation, Optimized for 65nm node Low Power CMOS Applications, Seiji Inumiya, Katsuyuki Sekine, Shoko Niwa, Akio Kaneko, Motoyuki Sato, Takeshi Watanabe, Hironobu Fukui, Yoshiki Kamata, Masato Koyama Akira Nishiyama, Mariko Takayanagi, Kazuhiro Eguchi and Yoshitaka Tsunashima, 2003 Symposium on VLSI Technology Digest of Technical Papers, Jun. 2003, 2 pgs.

* cited by examiner

*Primary Examiner*—David Nelms
*Assistant Examiner*—Andy Huynh
(74) *Attorney, Agent, or Firm*—Jacqueline J. Garner; W. James Brady, III; Frederick J. Telecky, Jr.

(57) ABSTRACT

High-k transistor gate structures and fabrication methods therefor are provided, wherein a gate dielectric interface region near a semiconductor substrate is provided with very little or no nitrogen, while the bulk high-k dielectric is provided with a uniform nitrogen concentration.

15 Claims, 3 Drawing Sheets

HIGH-K GATE DIELECTRIC WITH UNIFORM NITROGEN PROFILE AND METHODS FOR MAKING THE SAME

FIELD OF INVENTION

This invention relates generally to semiconductor devices and more particularly to high-k dielectric transistor gate structures and methods for fabricating the same.

BACKGROUND OF THE INVENTION

Field effect transistors (FETs) are widely used in the electronics industry for switching, amplification, filtering, and other tasks related to both analog and digital electrical signals. Most common among these are metal-oxide-semiconductor field-effect transistors (MOSFETs), wherein a metal or polysilicon gate contact or electrode is energized to create an electric field in a channel region of a semiconductor body, by which current is allowed to conduct between a source region and a drain region of the semiconductor body. The source and drain regions are typically formed by adding dopants to targeted regions on either side of the channel region in a semiconductor substrate. A gate dielectric or gate oxide, such as silicon dioxide ($SiO_2$), is formed over the channel region, typically by thermal oxidation. A gate electrode or gate contact (e.g., metal or doped polysilicon) is then formed over the gate dielectric, and the gate dielectric and gate electrode materials are then patterned to form a gate structure overlying the channel region of the substrate.

The gate dielectric is an insulator material, which prevents large currents from flowing from the gate into the channel when a voltage is applied to the gate electrode, while allowing such an applied gate voltage to set up an electric field in the channel region in a controllable manner. Continuing trends in semiconductor product manufacturing include reduction in electrical device feature sizes (scaling), as well as improvements in device performance in terms of device switching speed and power consumption. MOS transistor performance may be improved by reducing the distance between the source and the drain regions under the gate electrode of the device, known as the gate or channel length, and by reducing the thickness of the layer of gate oxide that is formed over the semiconductor surface.

However, there are electrical and physical limitations on the extent to which thickness of gate dielectrics formed of $SiO_2$ can be reduced. For example, very thin $SiO_2$ gate dielectrics are prone to large gate tunneling leakage currents resulting from direct tunneling through the thin gate oxide. In addition, there are conventional limitations on the ability to form such thin oxide films with uniform thickness. Furthermore, thin $SiO_2$ gate dielectric layers provide a poor diffusion barrier to dopants, for example, and may allow high boron dopant penetration into the underlying channel region of the silicon during fabrication of the source/drain regions.

Recent efforts directed to MOS device scaling have accordingly focused on high-k dielectric materials having dielectric constants greater than that of $SiO_2$, which can be formed in a thicker layer than scaled $SiO_2$, and yet which produce equivalent field effect performance. The relative performance of these high-k materials is often expressed as equivalent oxide thickness (EOT), because the alternative material layer may be thicker, while still providing the equivalent electrical effect of a much thinner layer of $SiO_2$. Because the dielectric constant is higher, a thicker high-k dielectric layer can be deposited to avoid or mitigate tunneling leakage currents, while still achieving the required value of EOT that is comparable to the EOT value of a thinner layer of thermally grown $SiO_2$.

High-k dielectrics are sometimes deposited directly over a silicon substrate to form a gate dielectric layer using chemical vapor deposition (CVD), atomic layer deposition (ALD), or physical vapor deposition (PVD) processes, wherein oxygen and/or nitrogen in the material reacts with the silicon at the interface. The performance and reliability of the resulting transistors, in turn, is dependent upon the quality of the high-k dielectric material in the bulk of the gate dielectric as well as the quality of the interface region between the high-k gate dielectric material and the underlying silicon. Thus, there is a need for improved gate structures and fabrication techniques by which high quality gate dielectrics and interfaces can be achieved using high-k dielectric materials.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention relates to high-k transistor gate structures and fabrication methods therefor, in which the gate dielectric interface region near the semiconductor substrate is essentially denuded of nitrogen, while the bulk high-k dielectric is provided with a uniform nitrogen concentration. The inventors have appreciated that providing uniform nitrogen concentrations in the bulk high-k dielectric operates to impede or block diffusion of boron or other impurities implanted in an overlying gate contact or electrode material, while also stabilizing the high-k material. At the same time, preventing large nitrogen concentrations in the interface portion of the gate dielectric structure inhibits mobility degradation and other performance problems in the resulting transistors.

In one aspect of the invention, transistor gate structures and gate dielectric structures therefor are provided, wherein the dielectric structure comprises a bulk portion and an interface portion. The bulk portion comprises a high-k dielectric material with a nitrogen concentration of about 3 atomic percent or more and a nitrogen concentration variation of about 4 percent or less, such as 3 percent or less in one example. The interface portion comprises dielectric material between the bulk portion and the semiconductor body with a nitrogen concentration of about 3 atomic percent or less, wherein the interface is about 3 monolayers thick or less in one example. The high-k dielectric nitrogen concentration may be made as high as desired to provide a barrier against boron diffusion into the underlying semiconductor body, such as up to about 40 atomic percent in one example. The high-k dielectric material in the bulk portion may be any high-k dielectric, for example, a metal silicon oxynitride comprising a metal such as Zr, Hf, La, Y, Gd, Eu, Pr, or Ce. In one implementation illustrated and described below, the nitrided high-k dielectric material of the bulk portion is hafnium silicon oxynitride (HfSiON).

In another aspect of the invention, methods are provided for forming a transistor gate structure, comprising depositing HfSiO over the semiconductor body using a chemical vapor deposition process, introducing nitrogen into the high-k dielectric material using a plasma nitridation process, and annealing the nitrided high-k dielectric material. A gate electrode layer is then formed over the bulk portion of the dielectric structure, and the gate electrode layer and the dielectric structure are patterned to provide a transistor gate structure. In one example illustrated and described below, the high-k dielectric material is HfSiON including an interface portion over the semiconductor body having a nitrogen concentration of about 3 atomic percent or less, as well as a bulk high-k portion over the interface with a nitrogen concentration of about 3 atomic percent or more and a nitrogen concentration variation of about 4 atomic percent or less.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
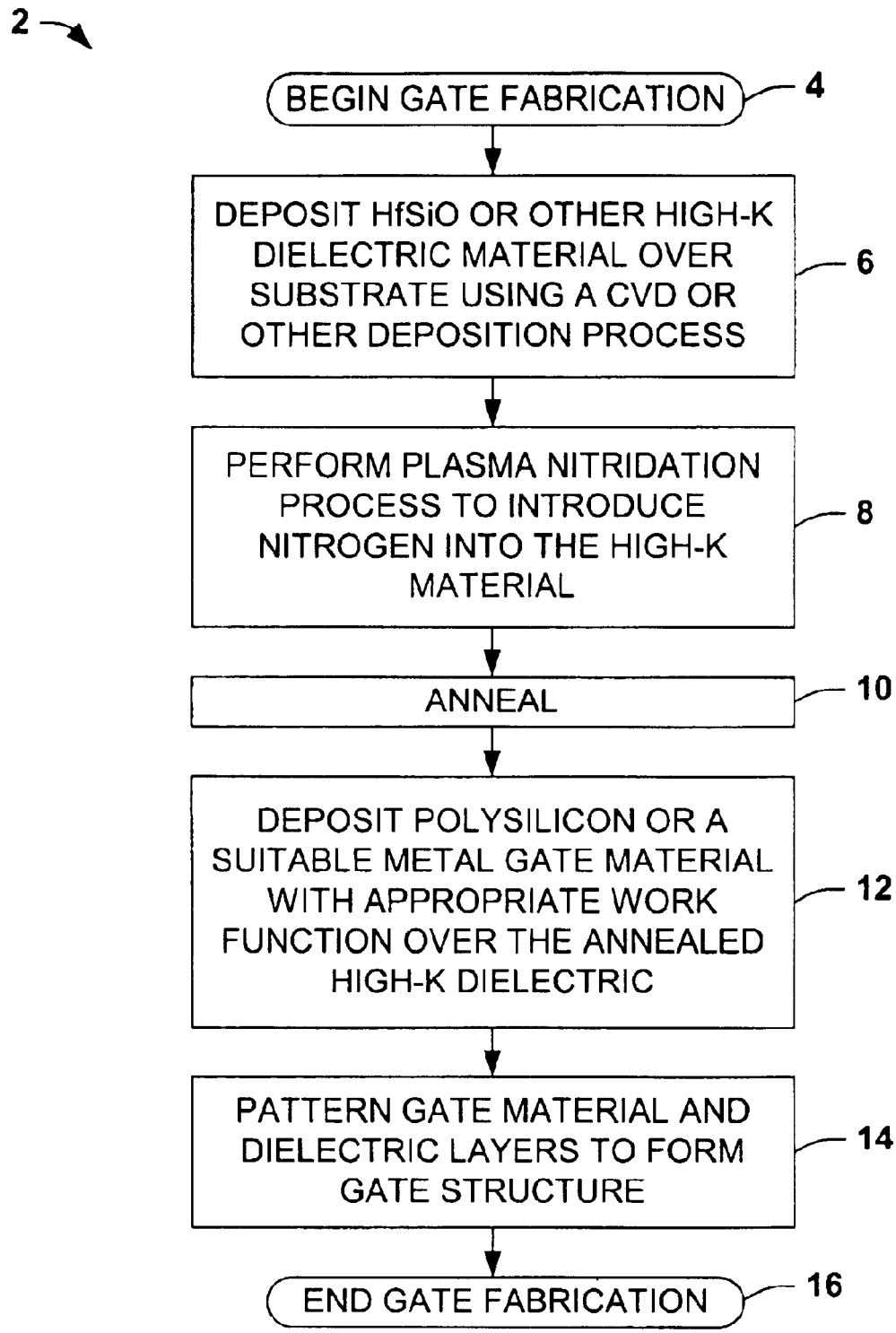
FIG. 1 is a flow diagram illustrating an exemplary method of fabricating transistor gate structures having uniform nitrogen concentration profiles in accordance with an aspect of the invention.

One or more implementations of the present invention will now be described with reference to the attached drawings, wherein like reference numerals are used to refer to like elements throughout. The invention relates to high-k gate dielectrics and methods for fabricating high-k gate structures in a semiconductor device, which may be employed in association with any type of semiconductor body, including silicon or other semiconductor substrates, as well as SOI wafers. The invention is illustrated and described hereinafter in the context of one or more examples, wherein the structures are not necessarily drawn to scale.

The inventors have appreciated that nitrogen may be advantageously provided in bulk portions of a high-k gate dielectric for blocking or inhibiting diffusion of boron from an overlying gate contact layer (e.g., polysilicon) into the underlying substrate or any other source. At the same time, however, the inventors have appreciated that high concentrations of nitrogen at the dielectric/semiconductor interface may lead to mobility degradation and other problems due to uncompleted bonds, which act as interface charging centers, causing interface states. The high density of such interface states at the interface or fixed charge may result in carrier mobility degradation in operation of the finished transistor, where the higher the density of the interface states, the greater the resulting mobility degradation. Thus, the inventors wish to provide nitrogen concentrations in the bulk high-k dielectric while minimizing the nitrogen concentrations at the interface.

The inventors have further appreciated that nitrogen may operate to stabilize the structure of the high-k dielectric material. In one example, the inventors have found that hafnium silicon oxide (HfSiO) crystalizes from an amorphous phase to a crystalline phase at temperatures less than about 1000 degrees C. Phase separation can also occur, wherein silicon dioxide ($SiO_2$) and hafnium oxide phases form and $HfO_2$ crystallizes. The introduction of nitrogen into HfSiO to provide hafnium silicon oxynitride (HfSiON), however, stabilizes the high-k material such that such phase separation does not occur at temperatures $\leq 1100$ degrees C. Thus, the inventors have found that nitrogen in the bulk portion of a high-k gate dielectric operates to inhibit boron diffusion as well as to stabilize the high-k material.

The inventors have further appreciated that where the nitrogen concentration in the bulk dielectric is non-uniform, different parts of the high-k material will have different temperature dependencies, and hence structural phase separation may still be a problem. A uniform nitrogen concentration in the high-k bulk dielectric is also believed to improve device reliability, wherein high-k dielectric composition uniformity improves both thermal and electrical stability.

The present invention accordingly provides controlled nitrogen concentration uniformity in high-k gate dielectric materials at concentrations able to successfully inhibit boron diffusion and stabilize the gate dielectric material, while also providing lower nitrogen concentration at the interface between the gate dielectric and the substrate.

The various aspects of the invention are illustrated and described below with respect to an exemplary high-k dielectric material HfSiON processed according to exemplary deposition and nitridation techniques. However, the invention and the appended claims contemplate nitrogen concentration uniformity in any type of high-k dielectric material with lower nitrogen concentration at the interface, wherein the gate structures may be formed using any semiconductor fabrication techniques and the invention is not limited to the specific examples illustrated and described herein. In this regard, the various aspects of the invention may be carried out in conjunction with high-k dielectrics, including but not limited to binary metal oxides including aluminum oxide ($Al_2O_3$), zirconium oxide ($ZrO_2$), hafnium oxide ($HfO_2$), lanthanum oxide ($La_2O_3$), yttrium oxide $Y_2O_3$), titanium oxide ($TiO_2$), as well as their silicates and aluminates; metal oxynitrides including aluminum oxynitride (AlON), zirconium oxynitride (ZrON), hafnium oxynitride (HfON), lanthanum oxynitride (LaON), yttrium oxynitride is (YON), as well as their silicates and aluminates such as ZrSiON, HfSiON, LaSiON, YSiON etc.; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate and others.

Referring initially to FIG. 1, an exemplary method 2 is illustrated for fabricating a transistor gate structure in accordance with one or more aspects of the present invention. While the exemplary method 2 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication and/or processing of the transistor gate structures and high-k dielectric films therefor which are illustrated and described herein as well as in association with other structures and films not illustrated.

The methods of the invention involve forming an interface dielectric and bulk high-k dielectric material over a semiconductor body to form a gate dielectric structure using a CVD deposition followed by a nitridation step and an anneal step. Using this technique, the gate dielectric nitrogen content can be controlled to improve device performance through uniform thermal and electrical stability. In one example illustrated below in FIG. 4, the interface portion has a nitrogen concentration of about 3 atomic percent or less, and the bulk high-k dielectric material has a nitrogen concentration of about 3 atomic percent or more and a nitrogen concentration variation of about 4 percent or less.

Gate fabrication in the exemplary method 2 begins at 4, where HfSiO or other high-k dielectric material is deposited at 6 using chemical vapor deposition (CVD), atomic layer deposition (ALD), or physical vapor deposition (PVD) processes to form an interface dielectric material over the semiconductor body and bulk dielectric material over the interface dielectric. Some of the possible chemistries that can be used for depositing HfSiO at 6 by CVD include:

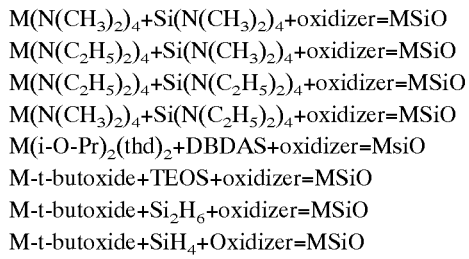

$M(N(CH_3)_2)_4 + Si(N(CH_3)_2)_4 + oxidizer = MSiO$ $M(N(C_2H_5)_2)_4 + Si(N(CH_3)_2)_4 + oxidizer = MSiO$ $M(N(C_2H_5)_2)_4 + Si(N(C_2H_5)_2)_4 + oxidizer = MSiO$ $M(N(CH_3)_2)_4 + Si(N(C_2H_5)_2)_4 + oxidizer = MSiO$ $M(i-O-Pr)_2(thd)_2 + DBDAS + oxidizer = MsiO$ M-t-butoxide+TEOS+oxidizer=MSiO $M$-t-butoxide+$Si_2H_6$+oxidizer=MSiO $M$-t-butoxide+$SiH_4$+Oxidizer=MSiO Where M=Zr, Hf, La, Y, Gd, Eu, Pr, or Ce, etc, $M(i-O-Pr)_2(thd)_2$ is bis(isopropoxy)bis(tetramethylheptanedionato) metal, DBDAS is $[(CH_3)CO]-Si-[(O_2C(CH_3)]_2$, M-t-butoxide is $C_{16}H_{36}O_4M$, and TEOS is tetraethoxysilane, $Si(OC_2H_5)_4$.

Atomic layer deposition can also be used to deposit the silicate materials by alternating the above precursors and an oxidizer during the process.

A plasma nitridation process is then performed at 8 to introduce nitrogen into the high-k material, followed by an anneal process at 10. The plasma nitridation process at 8 may be performed according to any suitable process parameters. One possible implementation is described in U.S. Pat. No. 6,136,654, issued Oct. 24, 2000 to Kraft et al., assigned to the assignee of the present invention Texas Instruments Incorporated, the entirety of which is hereby incorporated by reference as if fully set forth herein. A gate electrode or contact layer, such as polysilicon or a suitable metal gate material having an appropriate work function is then deposited or formed over the bulk portion of the dielectric structure at 12. The gate electrode layer and the dielectric structure are then patterned at 14 to provide a transistor gate structure before the method 2 ends at 16. In one implementation of the method 2, the high-k dielectric material comprises HfSiON with a nitrogen concentration of about 40 atomic percent or less, where the nitrogen concentration variation is about 4 percent or less in the bulk dielectric portion above the interface.

Figure 2A:
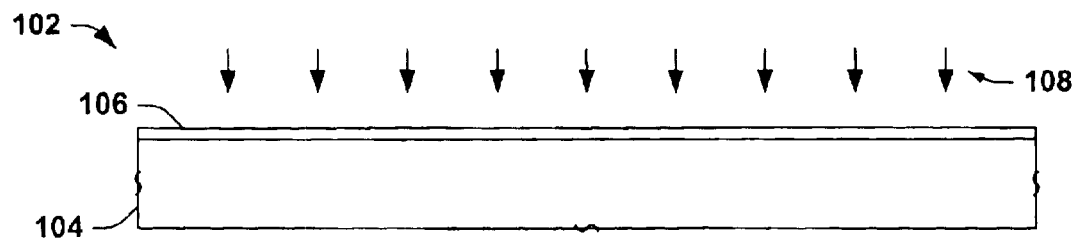
FIGS. 2A–2D are partial side elevation views in section illustrating formation of a transistor gate structure having uniform nitrogen concentration in accordance with another aspect of the invention.

FIGS. 2A–2D illustrate formation of a transistor gate structure having uniform nitrogen concentration generally in accordance with the exemplary method 2 in a semiconductor device 102. The device 102 comprises a semiconductor body 104, which may be a silicon substrate, an SOI wafer, or other semiconductor body. In FIG. 2A a suitable deposition process 108, e.g., thermal oxidation, plasma oxidation, or CVD, is employed to form an interface dielectric material portion 106 (e.g., SiO, SiON, HfSiO, or other high-k dielectric) over the semiconductor body 104. A CVD deposition process 109 is performed in FIG. 2B to form a bulk high-k dielectric material portion 110 over the interface 106. In the illustrated example, the process 109 is a CVD deposition as described above to form HfSiO in the bulk region, which may be a continuation of the process 108, where the interface 106 may comprise a dielectric such as SiO having a different dielectric constant k less than the bulk high-k material 110. Alternatively, other suitable separate processes may be employed to form the interface portion 106 and the bulk high-k material portion 110 within the scope of the invention.

Figure 2B:
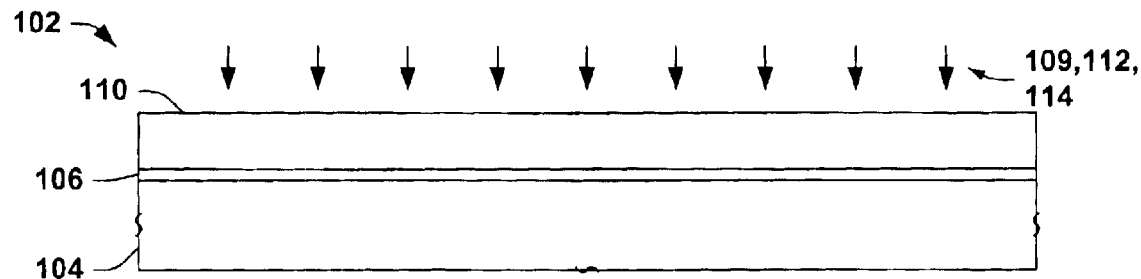

A plasma nitridation process 112 then is employed in FIG. 2B to provide nitrogen to the bulk material 110, after which an anneal process 114 is performed, such as in step 10 of the exemplary method 2 above. Following the plasma nitridation 112 and the post-deposition anneal 114, the bulk high-k dielectric material 110 comprises HfSiON with a nitrogen concentration of about 3–40 atomic percent and a nitrogen concentration variation of about 4 percent or less, preferably about 3 percent or less as illustrated below in FIG. 4. Further, the interface portion 106 comprises a dielectric material having a nitrogen concentration of about 3 atomic percent or less after the nitridation and anneal processes 112 and 114.

Figure 2C:
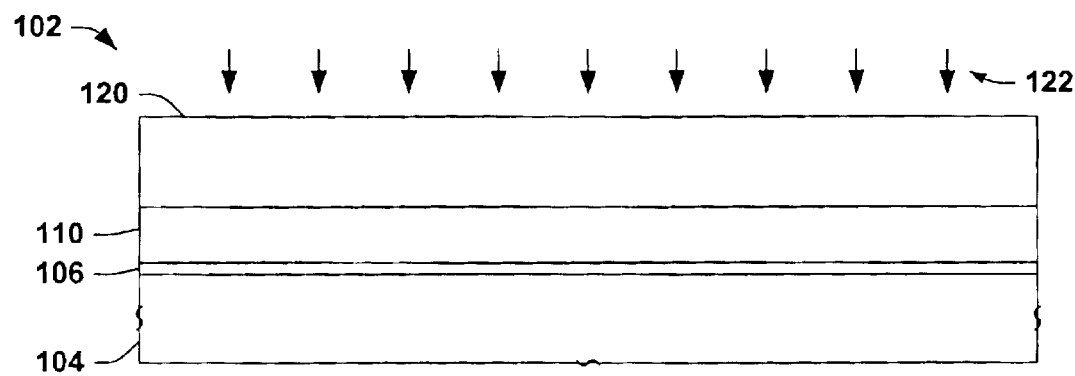
Figure 2D:
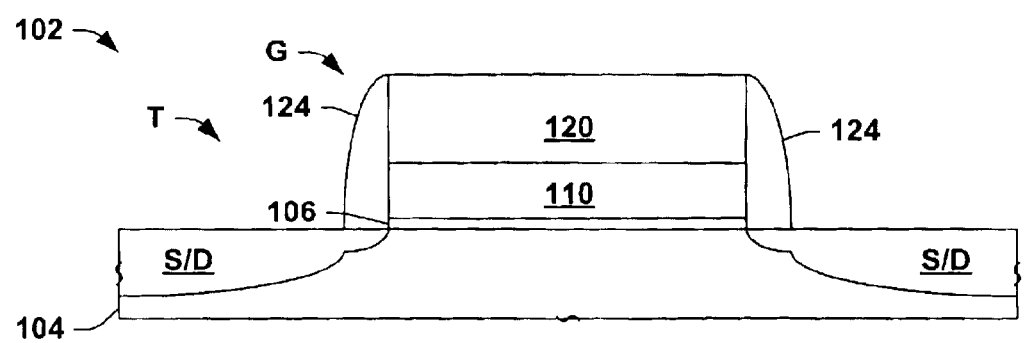

In FIG. 2C, the dielectric structure comprising the interface dielectric material 106 and the bulk high-k dielectric material 110 is then covered by a gate electrode or contact layer 120, such as polysilicon or a suitable metal gate material having an appropriate work function, via a deposition process 122. As shown in FIG. 2D, the gate electrode layer 120 and the dielectric structure 110,106 are then patterned to provide a transistor gate structure G. Thereafter, source/drains S/D and sidewall spacers 124 are formed to provide a MOS type transistor T as shown in FIG. 2D.

For the post-deposition anneal at 10 in the method 2 above, it is generally desirable to use an oxidizing ambient anneal in order to improve the electrical properties of the high-k dielectric film after deposition. This anneal can have the effects of reducing defects and ensuring that the film has the correct stoichiometry. Additionally, for CVD films, this oxidation anneal can help to remove carbon and/or OH from the film. This effect is expected to result in reduced leakage currents and possibly improved interface characteristics. However, this oxidizing anneal can also cause the growth of a lower dielectric-constant layer (primarily made up of $SiO_2$) between the high-k gate material and the Si substrate. Low temperature oxidizing anneals avoid increases in the EOT (effective oxide thickness) but do not allow for densification. Non-oxidizing (e.g., Ar, He or $N_2$) high temperature anneals allow for densification but typically do not heal defects or adjust for non-stoiciometry.

The inventors have found that the oxidation anneal can be designed to heal defects and improve the film properties while preventing the formation of unwanted lower dielectric constant interface layers. In one example, the post-deposition anneal is implemented as a two-step anneal wherein the first step is a high temperature anneal in a non-oxidizing ambient and the second step is a low temperature oxidizing anneal. In this example, the bulk high-k gate dielectric 110 is subjected to a first anneal in a non-oxidizing ambient, for example, comprising $N_2$. Other inert ambients such as Ar or He may alternatively be used. The first anneal is preferably performed at 700–1100 degrees C., for example at 1000 degrees C. in a $N_2$ ambient for about 60 sec at a pressure of 760 Torr, to density the bulk high-k gate dielectric material 110. A second anneal step may then be performed to heal the high-k dielectric 110 and interface defects in an oxidizing ambient. The oxidizing ambient may comprise $O_2$, $N_2O$, NO, ozone, UV $O_2$, and $H_2O_2$, wherein the second anneal is a lower temperature anneal, at a lower temperature than the first anneal (e.g., below about 1000 degrees C.) and may be a thermal anneal, with or without UV exposure, or a low temperature plasma process. In one example, the second anneal is performed at about 700 degrees C. at a pressure of about 1 Torr for about 60 seconds in an $O_2$ ambient.

Figure 3:
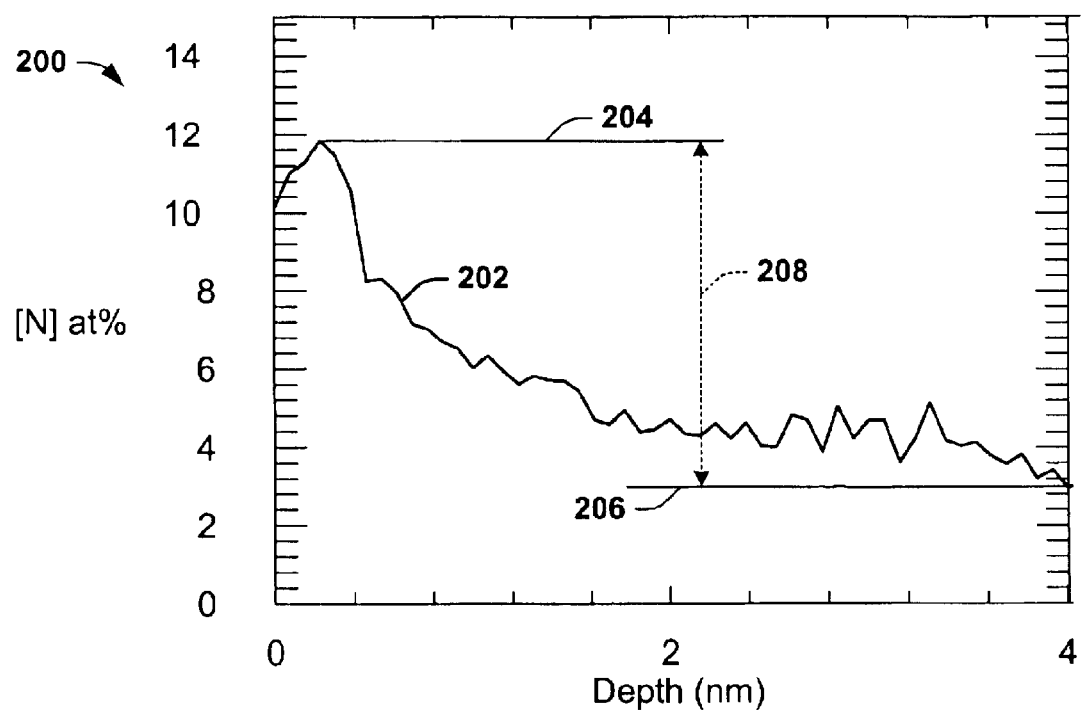
FIG. 3 is a graph illustrating nitrogen concentration vs. gate dielectric depth for a nitrided high-k dielectric with a non-uniform nitrogen concentration.
Figure 4:
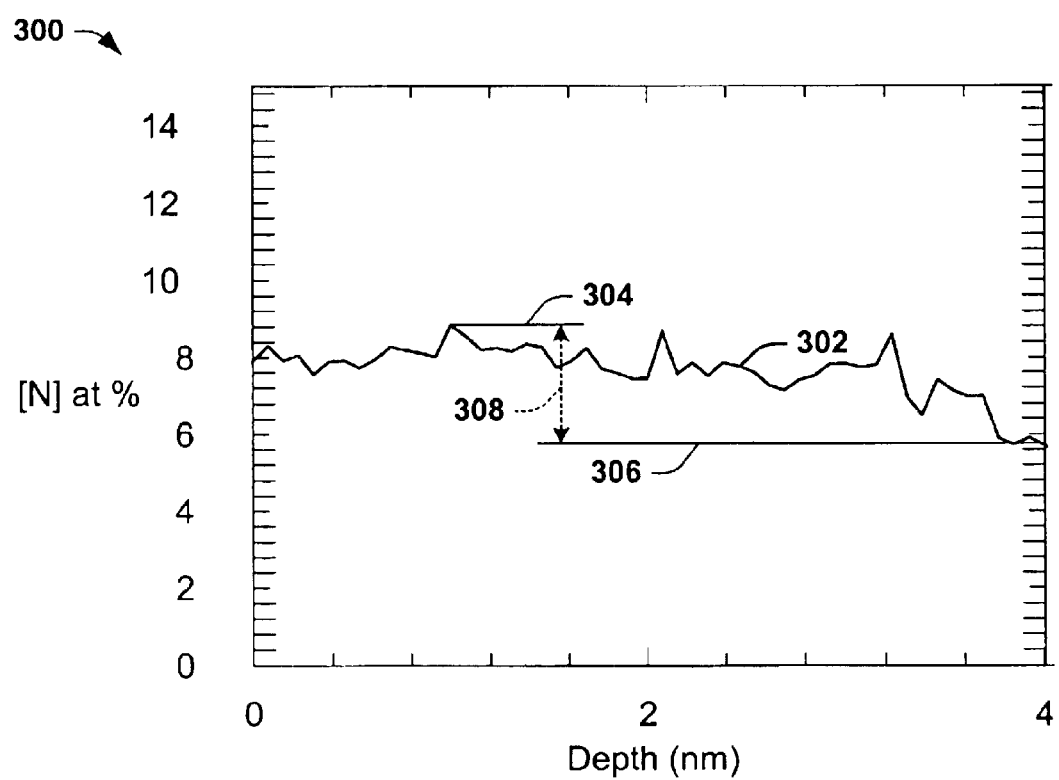
FIG. 4 is a graph illustrating nitrogen concentration vs. gate dielectric depth for a nitrided high-k dielectric with a uniform nitrogen concentration in accordance with the invention.

Referring now to FIGS. 3 and 4, exemplary nitrogen concentration vs. dielectric depth graphs 200 and 300 are provided for bulk gate dielectric structures processed using post-deposition plasma nitridation, and post-deposition plasma nitridation with annealing, respectively. The graph 200 in FIG. 3 shows a plot 202 having a peak concentration 204 of slightly under 12 atomic percent and a minimum concentration 206 of about 3.8 atomic percent in a bulk region 110 having a thickness of about 4 nm. The nitrogen profile of the curve 202 shows a nitrogen concentration variance 208 (e.g., max-min) of about 9 percent. In FIG. 4, a nitrogen concentration curve 302 has a maximum concentration 304 of about 8.8 atomic percent and a minimum concentration 306 of about 5.8 atomic percent for the bulk high-k dielectric material processed according to the invention. In this example, the bulk portion of the gate dielectric has a bulk nitrogen concentration variance 308 of about 3 atomic percent, wherein the nitrogen concentration of the interface portion (not shown) is less than about 3 atomic percent.

Other process steps may be employed to provide nitrogen of a uniform concentration in a bulk region within the scope of the invention. For example, nitrogen may be introduced during the CVD process to form HfSiON using ammonia, hydrazine or other active nitrogen sources as nitriding agents, or a plasma enhanced CVD (PECVD) process may be employed using $N_2$ as a nitriding agent. In another example, nitrogen may be incorporated during formation of the bulk high-k dielectric using a sputtering process. In another example, HfSiO may be formed by any deposition process, with a subsequent ammonia anneal under optimum temperature, pressure, and time to form HfSiON through the following chemistry:

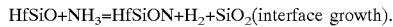

In still another example, plasma nitridation is performed on a deposited HfSiO bulk material using decoupled plasmas (e.g. AMAT's DPN), slot plane antenna (e.g., TEL's SPA) or remote plasma nitridation according to the following chemistry:

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A gate structure for a transistor in a semiconductor device, the gate structure comprising:

a dielectric structure formed over a semiconductor body, the dielectric structure comprising:

a bulk portion comprising a high-k dielectric material, the high-k dielectric material of the bulk portion comprising a nitrogen concentration of about 3 atomic percent or more and a nitrogen concentration variation of about 4 percent or less; and an interface portion comprising a dielectric material between the bulk portion and the semiconductor body, the interface portion having a nitrogen concentration of about 3 atomic percent or less; and a gate electrode structure comprising a conductive material formed over the bulk portion of the dielectric structure.

2. The gate structure of claim 1, wherein the high-k dielectric material of the bulk portion comprises a nitrogen concentration of about 40 atomic percent or less.

3. The gate structure of claim 2, wherein the high-k dielectric material of the bulk portion comprises a nitrogen concentration variation of about 3 percent or less.

4. The gate structure of claim 3, wherein the high-k dielectric material of the bulk portion is a metal silicon oxynitride, and wherein the metal is selected from the group consisting of Zr, Hf, La, Y, Gd, Eu, Pr, and Ce.

5. The gate structure of claim 4, wherein the high-k dielectric material of the bulk portion is HfSiON.

6. The gate structure of claim 1, wherein the high-k dielectric material of the bulk portion is a metal silicon oxynitride, and wherein the metal is selected from the group consisting of Zr, Hf, La, Y, Gd, Eu, Pr, and Ce.

7. The gate structure of claim 6, wherein the high-k dielectric material of the bulk portion is HfSiON.

8. The gate structure of claim 1, wherein the high-k dielectric material of the bulk portion comprises a nitrogen concentration variation of about 3 percent or less.

9. The gate structure of claim 1, wherein the interface portion of the dielectric structure is about 3 monolayers thick or less.

10. A gate dielectric structure in a semiconductor device, the gate dielectric structure comprising:

a bulk portion comprising a high-k dielectric material, the high-k dielectric material of the bulk portion comprising a nitrogen concentration of about 3 atomic percent or more and a nitrogen concentration variation of about 4 atomic percent or less; and an interface portion comprising a dielectric material between the bulk portion and a semiconductor body, the interface portion having a nitrogen concentration of about 3 atomic percent or less.

11. The gate structure of claim 10, wherein the interface portion of the dielectric structure is about 3 monolayers thick or less.

12. The gate dielectric structure of claim 10, wherein the high-k dielectric material of the bulk portion comprises a nitrogen concentration of about 40 atomic percent or less.

13. The gate dielectric structure of claim 10, wherein the high-k dielectric material of the bulk portion comprises a nitrogen concentration variation of about 3 percent or less.

14. The gate dielectric structure of claim 10, wherein the high-k dielectric material of the bulk portion is a metal silicon oxynitride, and wherein the metal is selected from the group consisting of Zr, Hf, La, Y, Gd, Eu, Pr, and Ce.

15. The gate dielectric structure of claim 14, wherein the high-k dielectric material of the bulk portion is HfSiON.

* * * * *